(12) United States Patent
Chen et al.

(10) Patent No.: US 6,808,988 B1
(45) Date of Patent: Oct. 26, 2004

(54) METHOD FOR FORMING ISOLATION IN FLASH MEMORY WAFER

(75) Inventors: Hung-Sheng Chen, San Jose, CA (US); Yowjuang W. Liu, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/019,409

(22) Filed: Feb. 5, 1998

(51) Int. Cl.[7] .................. H01L 21/336; H01L 21/76
(52) U.S. Cl. .................. 438/263; 438/296; 438/424; 257/321; 257/510
(58) Field of Search ........................... 257/321, 510; 438/263, 296, 424

(56) References Cited

U.S. PATENT DOCUMENTS

| | | | | |
|---|---|---|---|---|
| 4,698,900 A | * | 10/1987 | Esquivel | 438/296 |
| 5,087,584 A | * | 2/1992 | Wada et al. | 438/263 |
| 5,110,753 A | * | 5/1992 | Gill et al. | 438/263 |
| 5,469,383 A | * | 11/1995 | McElroy et al. | 365/185.01 |

* cited by examiner

Primary Examiner—Howard Weiss
(74) Attorney, Agent, or Firm—Farjami & Farjami LLP

(57) ABSTRACT

A method for making a self-aligned isolated memory core for a flash memory wafer includes the steps of establishing control gates for memory cells in the core by depositing a first polysilicon layer on a silicon substrate, etching the first layer, and depositing a second polysilicon layer on the substrate, with the polysilicon layers being separated by an interpoly dielectric layer. Then, after the control gates have been established, isolation trenches are formed in the silicon substrate between regions by self-aligned etching processes.

8 Claims, 2 Drawing Sheets

METHOD FOR FORMING ISOLATION IN FLASH MEMORY WAFER

TECHNICAL FIELD

The present invention relates generally to computer flash memory systems, and more particularly to systems and methods for isolating flash memory elements.

BACKGROUND OF THE INVENTION

Flash memory chips or wafers are used in many applications, including hand held computing devices, wireless telephones, and digital cameras. In flash memory, a flash memory core containing a matrix of memory elements is surrounded by a periphery containing peripheral elements. The elements in the core assume physical states which represent bits of data. Consequently, by configuring the core elements appropriately, data (such as preselected telephone numbers in a wireless telephone or digital images in a digital camera) may be stored in the core and subsequently read by detecting the physical state of one or more core elements.

To enable the individual memory elements of a flash memory wafer to maintain the physical state with which they have been programmed, each memory region must be isolated from its neighboring regions. In the case of the peripheral regions, isolation is achieved by a method referred to in the art as local oxidation silicon, or "LOCOS". LOCOS isolation requires disposing an inactive silicon oxide insulator between neighboring active regions. While acceptable for isolating peripheral regions, however, LOCOS isolation is less than desirable for memory core cell isolation. This is because it is desirable to minimize the distance between core cells to increase memory density, and the silicon in LOCOS isolation tends to encroach on the core memory cells, thereby decreasing core cell (and, hence, memory) density.

Accordingly, a process that renders closely spaced memory core cells, referred to in the art as "self-aligned" cells, has been developed. Self-aligned memory core cells are isolated from each other by shallow trenches that are etched into the silicon substrate of the core, between adjacent memory cells.

The memory cells between the trenches are established by one or more layers of polysilicon material. More specifically, a first layer of polysilicon is deposited onto a tunnel oxide that is grown on a silicon substrate, and the first layer of polysilicon is then etched, typically accompanied by or followed by isolation trench etching. Then, after the isolation trenches have been formed, the gates of the memory cells are established by depositing an interpoly dielectric layer on the wafer and a second layer of polysilicon on the interpoly dielectric layer, followed by etching the second layer of polysilicon as appropriate to form the desired memory element stack pattern and establish the gates of the memory cells. As recognized by the present invention, however, establishing the polysilicon gates of the memory cells after trench isolation complicates the fabrication process. As further recognized herein, a method can be provided for simplifying the relatively costly fabrication process.

Accordingly, it is an object of the present invention to provide a method and system for isolating core memory cells of a flash memory device. Another object of the present invention is to provide a method and system for isolating core memory cells of a flash memory device which does not require gate formation after trench etching. Still another object of the present invention is to provide a method and system for isolating core memory cells of a flash memory device that is easy to use and cost effective.

BRIEF SUMMARY OF THE INVENTION

A process is disclosed for making a flash memory core having source and drain regions. The process includes the steps of providing at least one silicon substrate, and establishing at least one tunnel oxide layer on the substrate. Plural stacks are established on the tunnel oxide layer, with each stack including a first polysilicon layer. At least one interpoly dielectric layer is formed on at least some of the stacks. Then, the method includes depositing at least one second polysilicon layer on at least a portion of the interpoly dielectric layer, such that plural memory cell control gates are established. After the control gates have been established, isolation trenches are established in the substrate.

In a preferred embodiment, the trenches are formed by etching such that at least adjacent drain regions of the memory core are separated from each other by a respective isolation trench. Likewise, the step of establishing the stacks is accomplished at least in part by dry etching.

As envisioned by the preferred embodiment described herein, the method further includes depositing a field oxide material on at least portions of the silicon substrate prior to the step of forming at least one interpoly dielectric layer. Additionally, channel stop dopant is implanted in the silicon substrate prior to the step of depositing a field oxide material. A flash memory wafer made according to the present method, and a computing device incorporating the flash memory wafer, are also disclosed.

In another aspect, a flash memory wafer includes a core memory region including at least one silicon substrate, and plural memory cells in the core memory region. Each memory cell has a gate established by at least two layers of polysilicon, and at least some regions of the core memory region are separated by isolation trenches that are formed after the control gates of the memory cells have been formed.

In still another aspect, a method for making a flash memory wafer includes establishing plural memory cell control gates on at least one silicon substrate, and forming isolation trenches on the substrate after the control gates have been established.

Other features of the present invention are disclosed or apparent in the section entitled: "DETAILED DESCRIPTION OF THE INVENTION."

BRIEF DESCRIPTION OF DRAWINGS

For fuller understanding of the present invention, reference is made to the accompanying drawing in the following detailed description of the Best Mode of Carrying Out the Present Invention. In the drawings.

Figure 1:
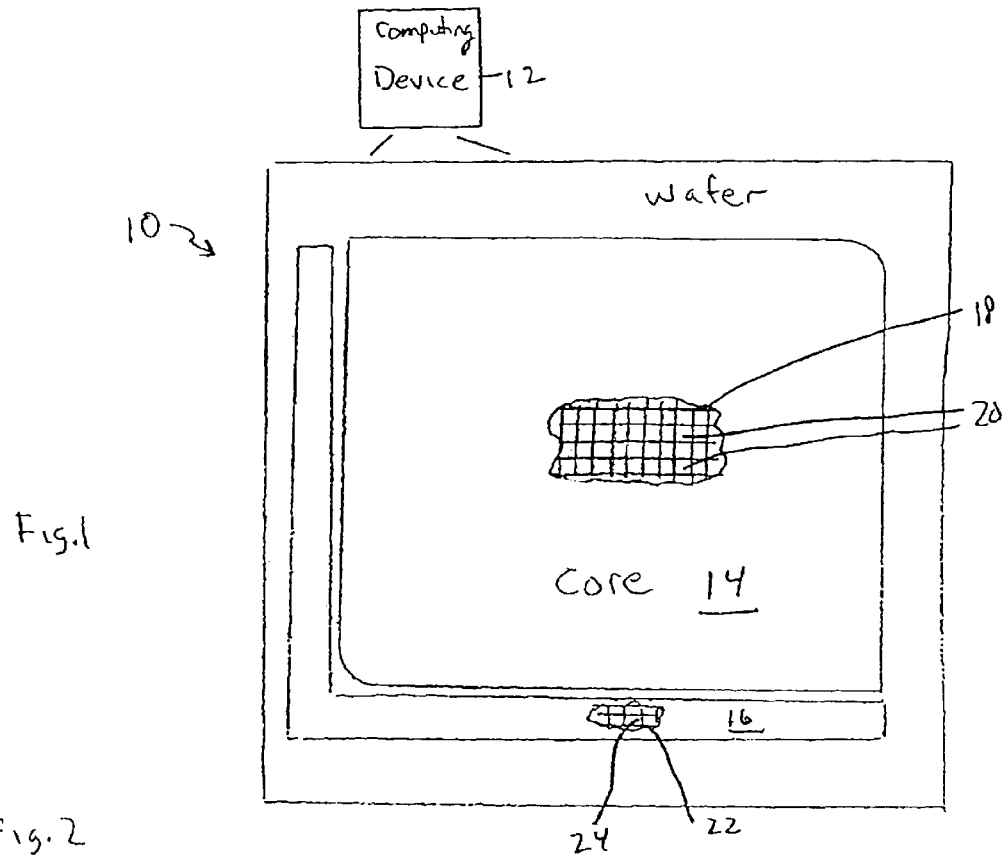
FIG. 1 is a schematic plan view of the present flash memory wafer in an exploded relationship with a computing device, with portions schematically cut away to show the memory elements.

Reference numbers refer to the same or equivalent parts of the present invention throughout the several figures of the drawing. In the description, the terms "vertical" and "horizontal" refer to the orientations of the figures shown, for purposes of disclosure, and do not necessarily refer to the orientation of the present wafer once the wafer is embodied in a computing device.

DETAILED DESCRIPTION OF THE INVENTION

Referring initially to FIG. 1, a flash memory wafer is shown, generally designated 10. The flash memory wafer 10 can establish any flash memory chip for use in the computer arts. In one preferred embodiment, the flash memory wafer can be an electrically programmable memory (EPROM). As shown in FIG. 1, the wafer 10 can be incorporated into a computing device 12, e.g., a digital camera, wireless telephone, or hand held computer, for use by the computing device 12.

FIG. 1 shows that the wafer 10 includes a core memory array 14 and a periphery region 16 bounding at least a portion of the core memory array 14. As can be appreciated in reference to FIG. 1, the core memory array 14 includes a grid or matrix 18 of core memory elements 20, each of which must be isolated from its neighbors. Similarly, the periphery region 16 includes a grid or matrix 22 of peripheral memory elements 24, each of which must be isolated from its neighbors. In accordance with the present invention, the peripheral memory elements 24 can be isolated from each other using the above-mentioned LOCOS method. On the other hand, to facilitate improved fabrication and closer spacing of core memory elements 20 (and, hence, higher memory capacity of the wafer 10), the core memory elements 20 are isolated from each other using the trench etching process disclosed herein.

The process of the present invention can best be understood in reference to FIGS. 2–6. Commencing at block 26 in FIG. 2 and referring particularly to FIG. 3, a tunnel oxide layer 28 is grown on a silicon substrate 30 in accordance with means known in the art. Then, at block 32 in FIG. 2 a polysilicon "1" layer 34 (FIG. 3) and a nitride layer 36, preferably silicon nitride ($SI_3N_4$), are deposited onto the tunnel oxide layer 28, it being understood that the nitride layer 36 is a polishing stop that is later removed from the stacks 39 discussed below.

Figure 2:
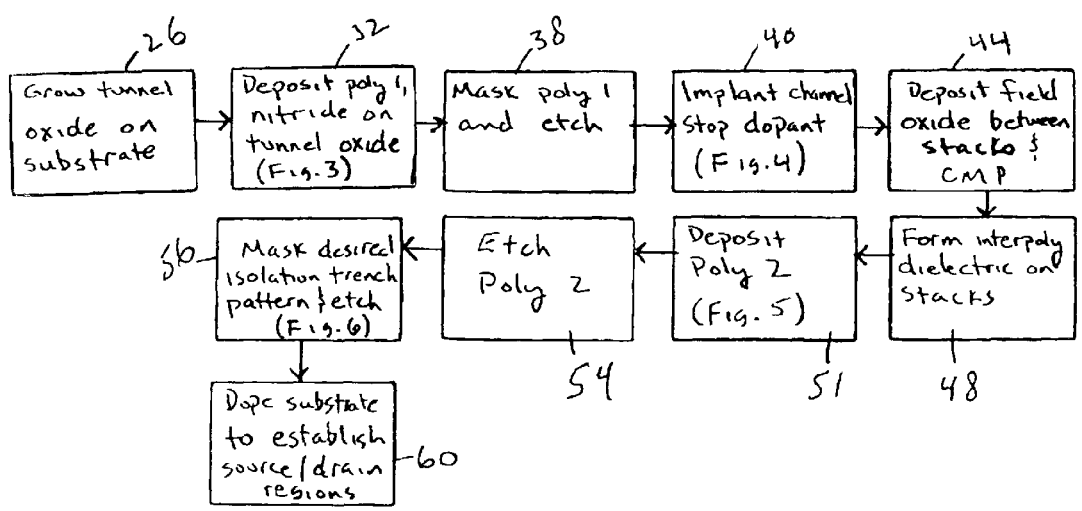
FIG. 2 is a flow chart of the present process.
Figure 3:
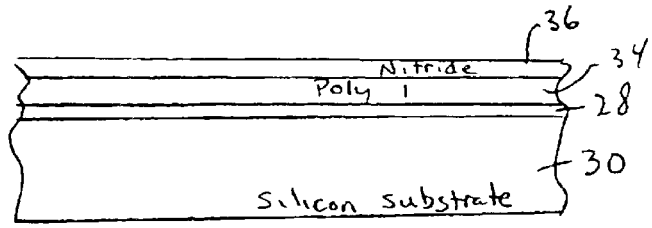
FIG. 3 is a schematic elevational view of a portion of the memory core from the bit line direction, before the stacks have been established on the silicon substrate.
Figures 4, 5:
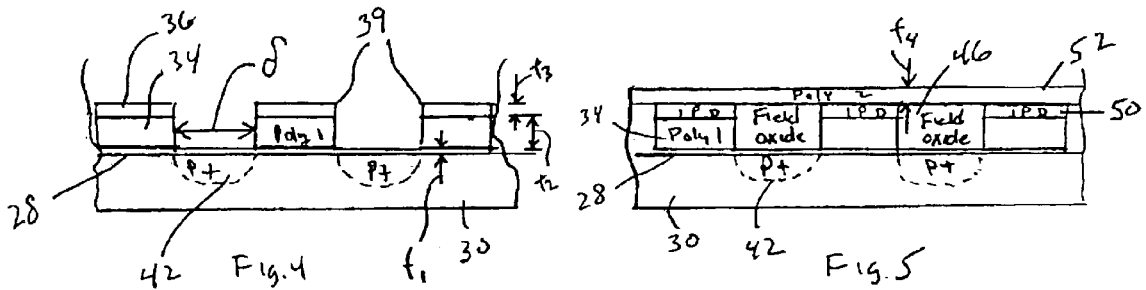
FIG. 4 is a schematic elevational view of a portion of the memory core from the word line direction, after the stacks have been established and after the channel stop regions have been doped.
FIG. 5 is a schematic elevational view of a portion of the memory core from the word line direction, after the field oxide has been deposited and planed and the polysilicon "2" layer has been deposited.

Moving to block 38 of FIG. 2 and referring to FIG. 4, a photoresist layer is deposited on the nitride layer 36 and exposed to ultraviolet light as appropriate to establish a predetermined mask for etching the polysilicon "1" layer 34 to thereby establish separated portions of polysilicon "1" material. The etching process can be accomplished by using a dry etch process such as a plasma etch process in accordance with dry etch procedures known in the art. As a result of the etching process, plural memory element stacks 39 are established above the tunnel oxide layer 28, with each stack 39 including a portion of the polysilicon "1" layer 34 and a portion of the nitride layer 36 as shown in FIG. 4. Per the present invention, the core memory of the present invention is a self-aligned isolated memory.

FIG. 4 shows that the distance 8 between stacks (after etching) is about four tenths of a micron (0.4μ). Additionally, it will be appreciated that each stack 39 that is established after etching includes a portion of the tunnel oxide layer 28 that has a thickness "$t_1$" of about fifty Angstroms to two hundred Angstroms (50 Å–200 Å). Also, the polysilicon "1" layer 34 of each stack 39 has a thickness "$t_2$" equal to about six hundred Angstroms to fifteen hundred Angstroms (600 Å–1500 Å), while the nitride layer 36 of each stack 39 has a thickness "$t_3$" about equal to twelve hundred Angstroms to seventeen hundred Angstroms (1200 Å–1700 Å).

Moving to block 40 of FIG. 2 and in continued cross-reference to FIG. 4, channel stop regions 42 are next implanted into the silicon substrate 30 in accordance with means known in the art. In one preferred embodiment, the channel stop regions 42 are established by doping portions of the silicon substrate 30 that are between stacks 39 with a dopant having a P+ conductivity, it being understood that the indicator "+" in the Figures indicates relatively strong doping and the indicator "−" in the Figures indicates relatively weak doping. In other embodiments, the channel stop regions can be doped with N+ dopant.

Once the self-aligned stacks 39 of the present wafer 10 have been established, the process moves to block 44, wherein field oxide layers 46 (FIG. 5) are formed between adjacent stacks 39, directly above the channel stop regions 42 in the silicon substrate 30. According to chemical-mechanical polishing (CMP) procedures known in the art, the field oxide is deposited and then polished down to the configuration shown. It is to be understood that the nitride layer 36 (FIG. 4) is partially removed during the CMP step. As those skilled in the art will recognize, the nitride layer 36 serves as a polishing stop, with the nitride layer 36 being completely removed in accordance with well-known principles prior to the deposition of the interpoly dielectric material discussed below.

As indicated at block 48 in FIG. 2 and as shown in FIG. 5, after removal of the nitride layer the next step in the present process is to deposit an interpoly dielectric layer 50 on the stacks 39. The interpoly dielectric layer 50 can be oxide-nitride-oxide ("ONO"). Next, at block 51 a polysilicon "2" layer 52 is deposited on the interpoly dielectric layer 50, and then etched using a dry etching process at block 54. Preferably, the thickness "i" of the polysilicon "2" layer 52 is about one thousand Angstroms to two thousand Angstroms (1000 Å–2000 Å).

Figure 6:
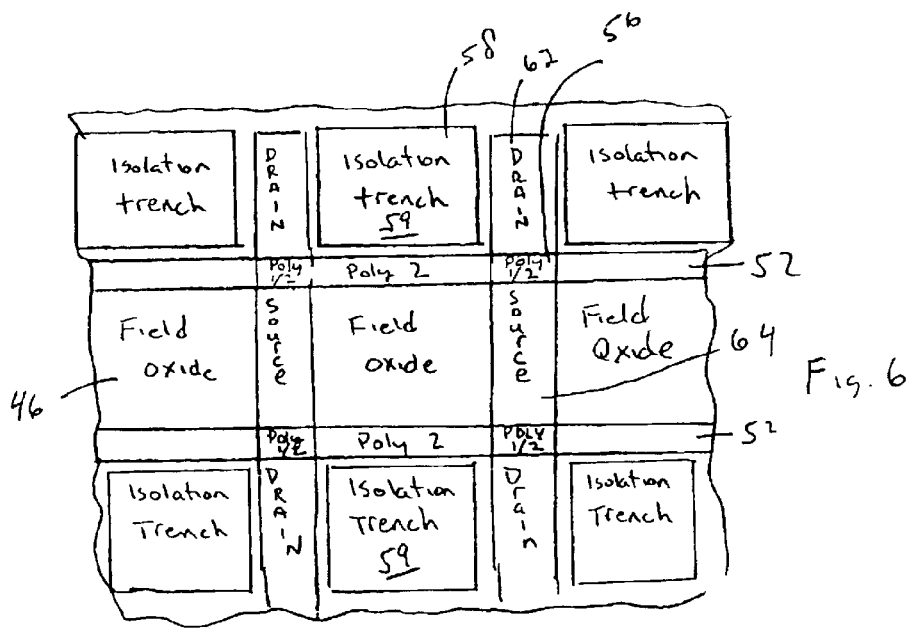
FIG. 6 is a schematic top plan view of a portion of the memory core after shallow isolation trench formation.

As can be appreciated in cross-reference to FIGS. 5 and 6, the pattern of etching of the polysilicon layer "2" layer 52 is orthogonal to the pattern of etching of the polysilicon "1" layer 34. Thus, after etching the polysilicon "2" layer 52 at block 54, the polysilicon "2" layer is arranged in parallel strips, whereas the polysilicon "1" layer, effectively having been etched twice (once at block 38 and again at block 54) is arranged in a pattern of small rectangles, with the portions of the remaining polysilicon "1" layer 34 being positioned between the polysilicon "2" layer 52 and the tunnel oxide 28 to establish control gate regions 56. Accordingly, control gates for the memory cells of the wafer 10 are established at block 54.

After control gate formation, at block 56 in FIG. 2 a photoresist mask is established over the polysilicon "2" layer 52. A dry etch process is then used to establish a predetermined pattern for isolation trenches 58, shown in FIG. 6. The trenches 58 are lined with a liner oxide and then filled with an insulative material 59 such as CVD oxide or TEOS, with the insulative material subsequently being planarized using CMP according to procedures known in the art.

Fabrication is completed at block 60, wherein drain and source regions 62, 64 (FIG. 6) are established by appropriately doping the silicon substrate 30. It is to be understood in reference to FIG. 6 that the isolation trenches 58 are shallow rectangular trenches formed in the silicon substrate 30 between adjacent drain regions 62 of the silicon substrate 30. In contrast, FIG. 6 shows that the field oxide regions 46 separate adjacent source regions 64 in the silicon substrate 30 from each other. As recognized by the present invention, the drain regions 62, to which relatively high bias voltages can be applied, are optimally isolated by the trenches 58 with insulative material 59, whereas the source regions 64 are adequately separated from each other by the field oxide layer 46 and are electrically connected to each other via the silicon substrate 30. This is achieved by removing the field oxide 46 in later conventional fabrication steps using a mask in accordance with well-known principles.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims, in which reference to an element in the singular is not intended to mean "one and only one" unless explicitly so stated, but rather "one or more". The inventions illustratively disclosed herein may be practiced without any element which is not specifically disclosed herein.

What is claimed is:

1. A process for making a flash memory core having source and drain regions, comprising the steps of:

providing at least one silicon substrate;

establishing at least one tunnel oxide layer on the silicon substrate after said step of providing said at least one silicon substrate;

establishing plural stacks on the tunnel oxide layer after said step of establishing said at least one tunnel oxide layer, each stack including a first polysilicon layer;

implanting channel stop dopant in the silicon substrate after said step of establishing said plural stacks;

depositing a field oxide material on at least portions of the silicon substrate over the channel stop dopant after said step of implanting said channel stop dopant;

forming at least one interpoly dielectric layer on at least some of the stacks after said step of depositing said field oxide material;

depositing at least one second polysilicon layer on at least a portion of the interpoly dielectric layer after said step of forming said at least one interpoly dielectric layer, such that plural memory cell control gates are established; and after the step of establishing plural memory cell control gates, establishing isolation trenches in the substrate.

2. The method of claim 1, wherein the substrate includes source and drain regions, and wherein the trenches are formed by etching such that at least adjacent drain regions of the memory core are separated from each other by a respective isolation trench.

3. The method of claim 1, wherein the establishing plural stacks step is accomplished at least in part by dry etching, and wherein each stack includes a nitride layer on the first polysilicon layer.

4. A method for making a flash memory wafer, comprising the steps of:

establishing a tunnel oxide layer on a silicon substrate;

implanting channel stop dopant in said silicon substrate after said step of establishing said tunnel oxide layer;

depositing a field oxide material on at least portions of said silicon substrate after said step of implanting said channel stop dopant;

establishing plural memory cell control gates on the silicon substrate after said step of depositing said field oxide material; and forming isolation trenches in the substrate after the control gates have been established.

5. The method of claim 4, wherein the establishing step is accomplished at least in part by dry etching, and wherein each control gate includes a first polysilicon layer.

6. The method of claim 5, further comprising the step of disposing an insulative material in at least some of the trenches.

7. The method of claim 5, further comprising the steps of:

forming at least one interpoly dielectric layer on the first polysilicon layers of at least same of the control gates; and depositing at least one second polysilicon layer on at least a portion of the interpoly dielectric layer, such that the plural memory cell control gates are established.

8. The method of claim 7, wherein the substrate includes source and drain regions, and wherein the trenches are formed by etching such that at least adjacent drain regions of the substrate are separated from each other by a respective isolation trench.

* * * * *